US011374576B1

(12) United States Patent
Ghotgalkar et al.

(10) Patent No.: US 11,374,576 B1
(45) Date of Patent: Jun. 28, 2022

(54) SELF-DIAGNOSTIC COUNTER

(71) Applicant: Texas Instruments Incorporated, Dallas, TX (US)

(72) Inventors: Shailesh Ganapat Ghotgalkar, Bangalore (IN); Prasanth Viswanathan Pillai, Karnataka (IN); Maheedhar Janaki Jalasutram, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/138,569

(22) Filed: Dec. 30, 2020

(51) Int. Cl.
*H03K 23/00* (2006.01)
*G06F 1/04* (2006.01)
*H03K 23/58* (2006.01)
*H03K 21/40* (2006.01)
*H03K 21/38* (2006.01)
*H03K 23/40* (2006.01)

(52) U.S. Cl.
CPC ............. *H03K 23/005* (2013.01); *G06F 1/04* (2013.01); *H03K 21/38* (2013.01); *H03K 21/40* (2013.01); *H03K 23/40* (2013.01); *H03K 23/58* (2013.01)

(58) Field of Classification Search
None
See application file for complete search history.

(56) References Cited

U.S. PATENT DOCUMENTS

| | | | | |
|---|---|---|---|---|
| 3,567,916 A * | 3/1971 | Fulton, Jr. | ............... | G06F 11/28 377/28 |
| 4,107,649 A * | 8/1978 | Kurihara | ................. | G06F 11/10 714/703 |
| 4,373,201 A * | 2/1983 | Bohan, Jr. | ............... | F23N 5/203 377/29 |
| 4,606,057 A * | 8/1986 | van Baardewijk | .... | H03K 21/40 377/28 |
| 5,440,604 A * | 8/1995 | De Subijana | ........... | G06F 11/10 377/28 |
| 7,962,829 B2 * | 6/2011 | Atsumi | ................... | G06F 11/10 714/758 |
| 2007/0091713 A1 * | 4/2007 | Wang | ................... | G11C 7/1018 365/233.12 |
| 2008/0165913 A1 * | 7/2008 | Roquelaure | .... | G01R 31/318527 377/29 |

* cited by examiner

Primary Examiner — Tuan T Lam
(74) Attorney, Agent, or Firm — Brian D. Graham; Charles A. Brill; Frank D. Cimino

(57) ABSTRACT

In described examples, a counter system includes a counter, a parity detector, a toggle flop, and a comparator. The counter iterates a count through a set of binary states in response to a clock signal, so that a binary value of a single bit of the count changes at each iteration. The parity detector detects the parity of the count. The toggle flop output is coupled to the toggle flop input. The toggle flop outputs a binary flop value. The binary flop value toggles between zero and one in response to the toggle flop input and the clock signal. The comparator compares the parity of the count and the toggle flop output, and outputs a first comparator value if the parity of the count and the toggle flop output are the same, and a second comparator value if the parity of the count and the toggle flop output are different.

22 Claims, 4 Drawing Sheets

SELF-DIAGNOSTIC COUNTER

TECHNICAL FIELD

This application relates generally to control systems, and more particularly to detecting faults in continuously running counters.

BACKGROUND

In many applications, redundant counters are used to monitor system critical timers and counters, such as counters controlling pulse width modulation and timers controlling safety processes. These redundant counters are compared against the monitored counters to detect fault conditions, and in some examples are run continuously to avoid missing transient fault conditions.

Continuously running counters that are essential to system function can use diagnostic circuitry to help ensure that counting functions are not interrupted by a fault, such as a failure in count advancement. Accordingly, when diagnostic circuitry detects a counting fault, the fault can be addressed, for example, to enable recovery.

FIG. 1 shows an example of a prior art counter with diagnostic circuitry 100. A counter 102 maintains an N bit wide binary count, and outputs each digit of its binary count to a first input of a respective XOR gate 104_1, 104_2, 104_3, ..., 104_N. A redundant counter 106 maintains a separate N bit wide binary count that is configured to be the same as the count maintained by the counter 102. The redundant counter 106 outputs each digit of its binary count to a second input of a respective one of the XOR gates 104_1, 104_2, 104_3, ..., 104_N. The XOR gates 104_1, 104_2, 104_3, ..., 104_N output their results to an N-input check OR gate 108. Accordingly, the redundant counter 106 provides a check for the counter 102, so that fault conditions in the counter 102 resulting in count errors will be detected: the output of the check OR gate 108 will change from a logical zero to a logical one if the counts of the counter 102 and the redundant counter 106 differ. The counter 102 similarly provides a check for the redundant counter 106.

The counter with diagnostic circuitry 100 can also include a test OR gate 110, with a first input connected to the output of the check OR gate 108, a second input connected to a test mode signal 112, and an output corresponding to the output 114 of the counter with diagnostic circuitry 100. The test mode signal 112 can be used to force the output 114 to indicate a fault condition, for example, for diagnostic purposes. Counter faults can be caused by, for example, permanent faults or transient faults. Some examples of such faults are described in functional safety standards such as International Organization for Standardization (ISO) standard ISO 26262 (road vehicles—functional safety), and International Electrotechnical Commission (IEC) standard IEC 61508 (functional safety of electrical/electronic/programmable electronic safety-related systems).

SUMMARY

In described examples, a counter system includes a counter, a parity detector, a toggle flop, and a comparator. The counter iterates a count through a set of binary states in response to a clock signal, so that a binary value of a single bit of the count changes at each iteration. The parity detector detects the parity of the count. The toggle flop output is coupled to the toggle flop input. The toggle flop outputs a binary flop value. The binary flop value toggles between zero and one in response to the toggle flop input and the clock signal. The comparator compares the parity of the count and the toggle flop output, and outputs a first comparator value if the parity of the count and the toggle flop output are the same, and a second comparator value if the parity of the count and the toggle flop output are different.

DETAILED DESCRIPTION

Figure 1:
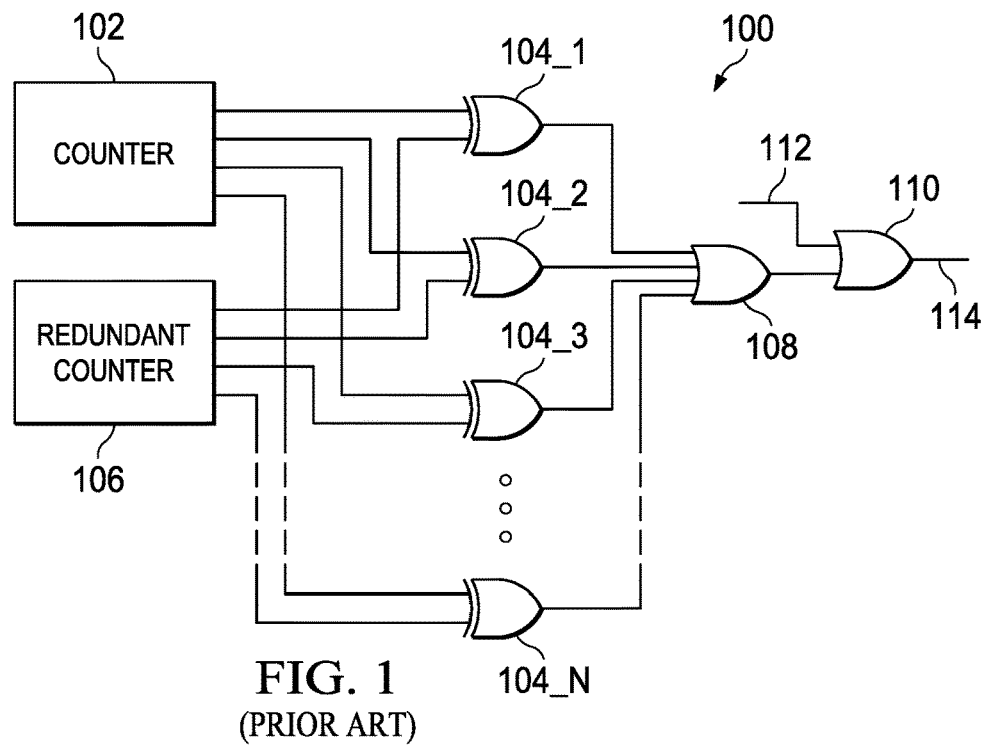
FIG. 1 shows an example functional block layout of a prior art counter with diagnostic circuitry.
Figure 2A:
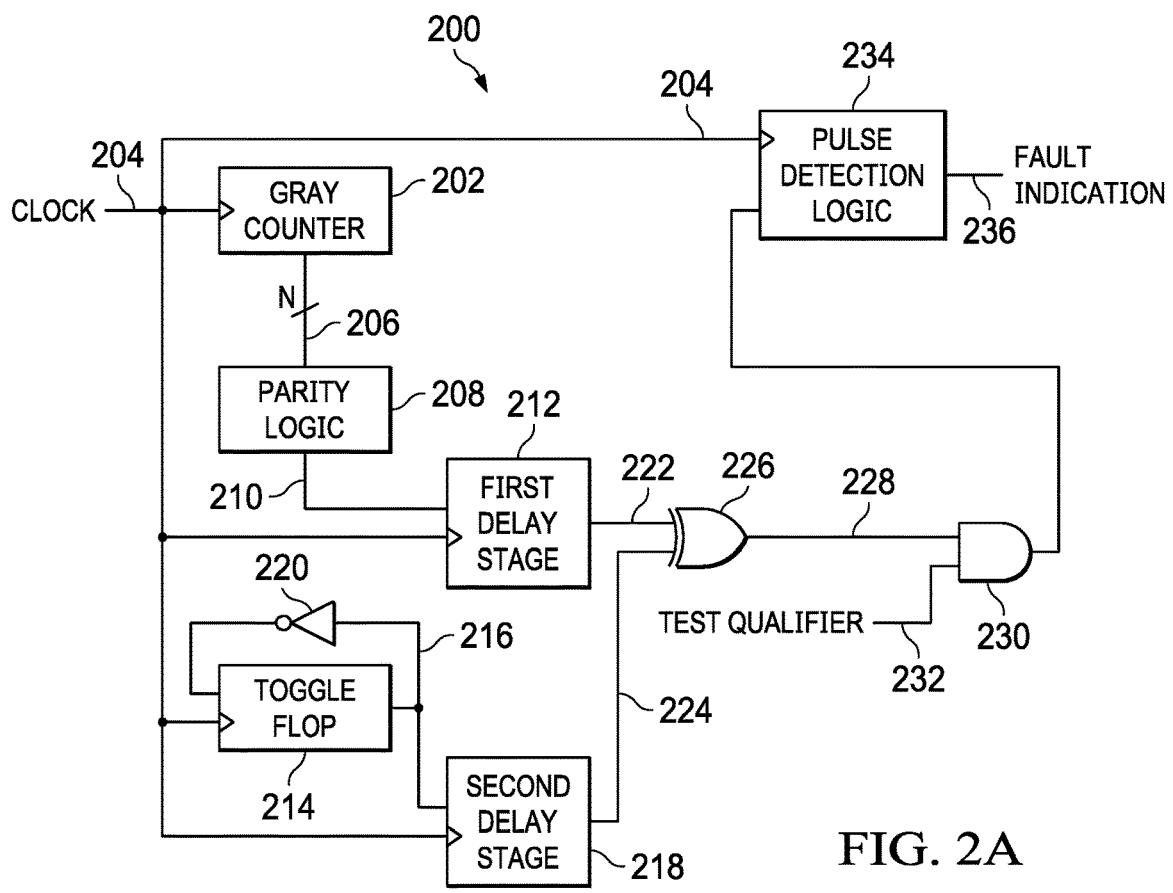
FIG. 2A shows an example functional block layout of a counter with diagnostic circuitry.

FIG. 2A shows an example embodiment functional block layout of a counter with diagnostic circuitry 200. A Gray counter 202 is clocked by a clock signal 204. The Gray counter 202 outputs a Gray counter output signal 206, that is a number N bits wide, to a parity logic 208. The parity logic 208 outputs a parity logic output signal 210 to a first delay stage 212, which is clocked by the clock signal 204. A toggle flop 214 is also clocked by the clock signal 204. The toggle flop 214 outputs a toggle flop output signal 216 to a second delay stage 218, and to an inverter 220 that outputs back to the data input of the toggle flop 214. Accordingly, the output of the toggle flop 214 is coupled to the input of the toggle flop 214 via the inverter 220.

The first delay stage 212 outputs a delayed parity logic output signal 222. The second delay stage 218 outputs a delayed toggle flop output signal 224. The delayed parity logic output signal 222 and the delayed toggle flop output signal 224 are input to a comparison logic 226, such as an XOR logic gate. The comparison logic 226 can use logic other than an XOR logic gate, such as an XNOR logic gate. The comparison logic 226 outputs a comparison logic output signal 228 to an AND logic gate 230. The AND logic gate 230 also receives a test qualifier signal 232 as a second input. The AND logic gate 230 outputs to a pulse detection logic 234. The pulse detection logic 234 receives the clock signal 204, and outputs an error indication signal 236. A counter with diagnostic circuitry 200 as shown in FIG. 2A can be operated as a continuously running counter used to monitor performance of other systems, such as safety systems and other critical systems.

A Gray counter (also called a Gray code counter) is a counter that, instead of counting in numerical binary order, counts by changing a single binary digit at each increment. An example of counting in numerical order in binary (base 2), corresponding to 0 1 2 3 4 (in base 10), is 000 001 010 011 100. Accordingly, for the count from one to two, two different bits, namely the least significant bits, both change in the transition from 001 to 010. An example of a Gray count, which in some examples can correspond to a count in numerical order of 0 1 2 3 4, is 000 001 011 010 110, so that only one bit changes per count increment. A Gray counter maps one-to-one to a corresponding count in numerical order. A Gray counter is also cyclic, with the last entry in a count cycle or a Gray counter being a single binary digit change away from the first entry in the count cycle. Incrementing the last entry in a Gray count cycle returns the first entry in the Gray count cycle. Accordingly, the Gray count described above can continue, corresponding to count values 5 6 7 0 of a three bit (modulo 8) binary counter, as 111 101 100 000.

The Gray counter increments in response to the clock signal 204, for example, in response to a rising (or falling) clock edge of the clock signal 204. The Gray counter 202 increments by toggling a binary value of a single digit of the count maintained by the Gray counter 202. For example, the Gray counter 202 can be incremented from 011 to 010 to 110. These are the third, fourth, and fifth count entries in the count sequence described above, and correspond to 3, 2, and 6, respectively, in conventional base-2 notation.

The parity logic 208 receives the output of the count maintained by the Gray counter 202 and determines and outputs the parity of the count. For example, adding together the individual digits of the count modulo 2. For example, the parity of the count described above would toggle from 0 for 011 (0+1+1 modulo 2=0), to 1 (0+1+0 modulo 2=1), to 0 (1+1+0 modulo 2=0). Generally—when normal operation is not interrupted by faults or other events outside normal incrementing—the parity of the Gray counter 202 toggles between logical zero and logical one on each clock cycle of the clock signal 204. Fault response for the Gray counter 202 is addressed with respect to FIG. 3B.

The Gray counter 202 can maintain, for example, a 32-bit count, or a 64-bit count, or a count of a different maximum value. The Gray counter 202 can maintain its count with a selected maximum (corresponding to counting modulo a selected value). The Gray counter 202 can be used for purposes other than or in addition to critical process monitoring, such as in cross clock domain read or update. In some examples, some or all of a redundant counter, a monitored counter, and a logic that reads counter values can be part of different clock domains, which can cause incorrect reading of counter values. Gray counters, however, change only one bit at a time, which can help to avoid inconsistencies that can result in conventional base-2 numerical counters due to spurious intermediate values (one bit at a time changing when a count iteration changes multiple bits, such as from 011 to 100, corresponding to counting from 3 to 4). Spurious intermediate values can be caused by, for example, race conditions in signals corresponding to different bits of a count.

The first delay stage 212 stores and outputs, in response to the clock signal 204, the logical value of the parity logic output signal 210 received from the parity logic 208. The first delay stage 212 can update its storage and output on a rising (or falling) clock edge of the clock signal 204.

The toggle flop 214 stores and outputs the output of the inverter 220 in response to the clock signal 204, such as a rising (or falling) clock edge of the clock signal 204. The inverter 220 receives the output of the toggle flop 214 as input, and outputs the logical opposite of the output of the toggle flop 214. This causes the toggle flop 214 to store and output, during each clock cycle of the clock signal 204, the logical opposite of the value the toggle flop 214 stored and outputted during the previous clock cycle of the clock signal 204. Accordingly, without a fault in the toggle flop 214 or the inverter 220, the toggle flop 214 toggles between logical zero and logical one, changing value once on each cycle of the clock signal 204.

The second delay stage 218 stores and outputs, in response to the clock signal 204, the logical value of the toggle flop output signal 216 received from the toggle flop 214. The second delay stage 218 can update its storage and output on a rising (or falling) clock edge of the clock signal 204—in particular, the same rising (or falling, respectively) clock edge of the clock signal 204 as used by the first delay stage 214. Accordingly, the first and second delay stages 212, 218 synchronize updates to the delayed parity logic output signal 222 (the first delay stage 212 output) and the delayed toggle flop output signal 224, respectively, in response to the clock signal 204. This enables avoidance of glitches in the comparison logic output signal 228 by reducing (or eliminating) timing differences between transitions in the delayed parity logic output signal 222 and the delayed toggle flop output signal 224 during nominal operation of the counter with diagnostic circuitry 200. Avoiding glitches in the comparison logic output signal 228 increases the likelihood that changes in the comparison logic output signal 228 correspond to fault conditions in the counter with diagnostic circuitry 200, rather than timing mismatches in output signal transitions.

The comparison logic 226 outputs a first value (for example, a logical zero) if the delayed parity logic output signal 222 and the delayed toggle flop output signal 224 have the same logical value. The comparison logic 226 outputs a second value (for example, a logical one) if the delayed parity logic output signal 222 and the delayed toggle flop output signal 224 have different logical values. During nominal operation of the Gray counter 202, the comparison logic output signal 228 will have a nominal operation value, corresponding to the input signals to the comparison logic 226 being either the same or different. When a fault occurs in the Gray counter's 202 count, the comparison logic output signal 228 will have a faulty operation value (for example, a logical zero or a logical one) that is complementary to the nominal operation value (for example, a logical one or a logical zero, respectively). As described above, during nominal operation, the binary value of one bit of the Gray counter 202 will toggle during each clock cycle of the clock signal 204, resulting in the parity of the count—and the delayed parity logic output signal 222—toggling on a clock edge during each clock cycle. Similarly, the delayed toggle flop output signal 224 will toggle on the same clock edge during each clock cycle. A fault condition of the Gray counter 202 corresponds to the Gray counter 202 failing to count, causing the parity of the count—and the delayed parity logic output signal 222—not to change. Accordingly, if the counter with diagnostic circuitry 200 experiences a fault condition, the comparison logic signal 228 will have the faulty operation value for at least once clock cycle.

If the AND logic gate 230 receives the test qualifier signal 232, then the comparison logic output signal 228 is passed to the pulse detection logic 234. Conversely, if the AND logic gate 230 does not receive the test qualifier signal 232, then the comparison logic output signal 228 is not passed to the pulse detection logic 234, suppressing detection of any comparison logic output signals 228 with the faulty operation value. Alternatively, the input of the AND logic gate 230 corresponding to the test qualifier signal 232 can include a logical inverter, which would mean that receipt of the test qualifier signal 232 would suppress detection of comparison logic output signals 228 with the faulty operation value. In this case, the test qualifier signal 232 could be considered a test suppression signal. Regardless, the presence or absence of the test qualifier signal 232 (depending on implementation details) can be used to determine periods of operation of the counter with diagnostic circuitry 200, and to prevent spurious reporting of fault conditions—for example, during testing of a system that includes the counter with diagnostic circuitry 200. Accordingly, in some examples, the AND logic gate 230 acts like a switch, and can be considered an on/off switch for fault detection functionality of the counter with diagnostic circuitry 200. For example, the test qualifier signal 232 can be used to suppress detection of spurious reporting of fault conditions during initial configuration or reset of the counter with diagnostic circuitry 200.

The pulse detection logic 234 outputs a fault indication signal 236 in response to the output of the AND gate 230. If the pulse detection logic 234 receives a comparison logic output signal 228 (passed by the AND gate 230) that has the faulty operation value for at least a clock cycle of the clock signal 204, the pulse detection logic 234 outputs a fault indication signal 236 that indicates a fault condition. Otherwise, the pulse detection logic outputs a fault indication signal 236 that does not indicate a fault condition.

In some examples, the counter with diagnostic circuitry 200 of FIG. 2A can be used as a continuously running redundant counter, without the area and power cost incurred by a redundant counter, and without software intervention. In some examples, this counter with diagnostic circuitry 200 can be used to detect both permanent and transient faults.

Figure 2B:
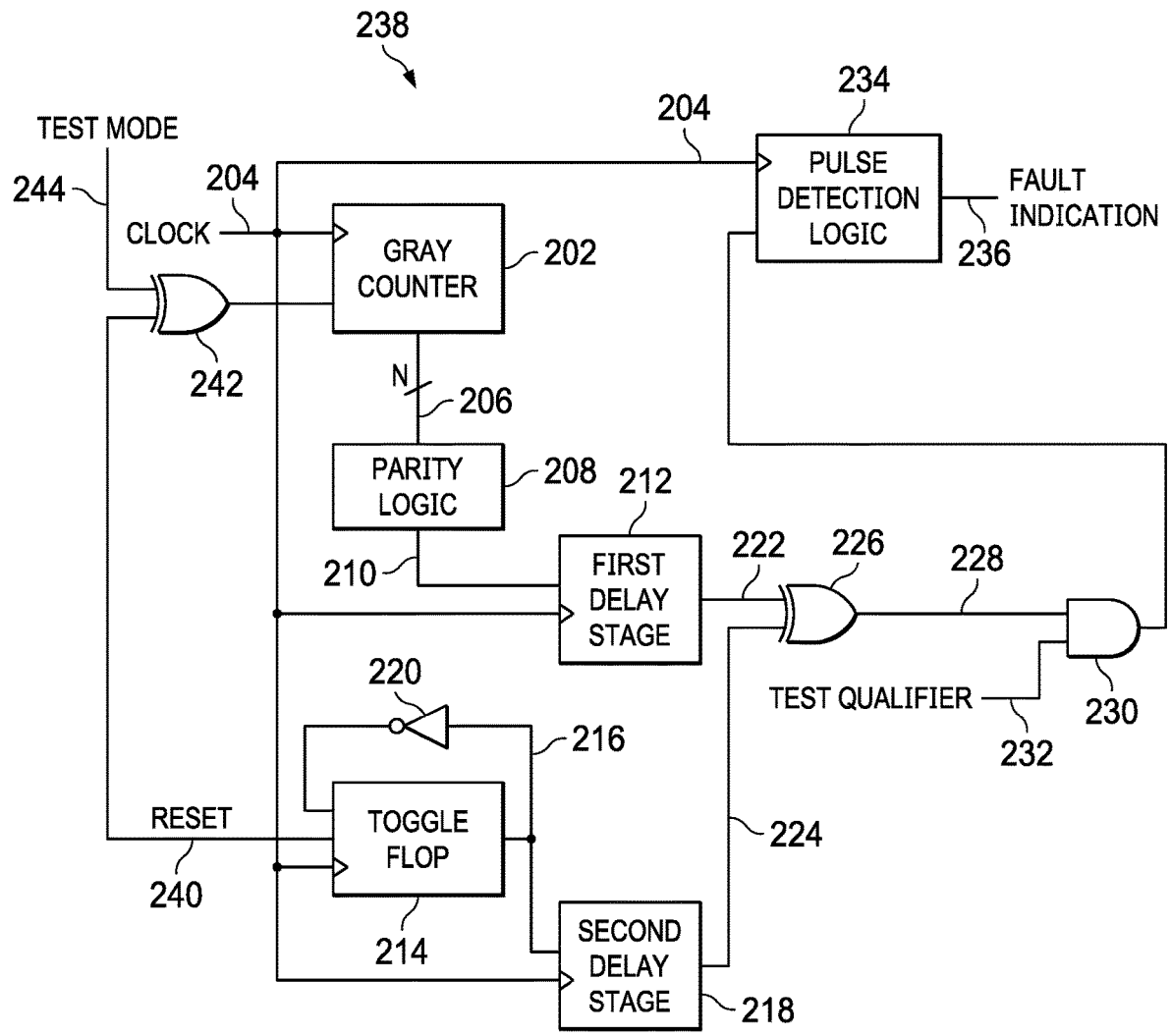
FIG. 2B shows an example functional block layout of a counter with diagnostic circuitry, with a reset signal.

FIG. 2B shows an example functional block layout of a counter with diagnostic circuitry 238. In some embodiments, a second XOR gate 242 receives an active low reset signal 240 and an active low test mode signal 244. The reset signal 240 is logical 0 when asserted, and logical 1 when not asserted (deasserted). The test mode signal 244 is also a logical 0 when asserted, and a logical 1 when not asserted (deasserted). The Gray counter 202 includes an input connected to receive an output of the second XOR gate 242. The toggle flop 214 includes an input connected to receive the reset signal 240. The reset signal 240 resets the Gray counter 202 (via the second XOR gate 242) and the toggle flop 214. The test mode signal 244 is not asserted during normal operation of the counter with diagnostic circuitry 238. The second XOR gate 242 will output a signal that will cause the Gray counter 202 to reset when the reset signal 240 and the test mode signal 244 are different, but not when the reset signal 240 and the test mode signal 244 are the same. Accordingly, when the reset signal 240 is asserted and the test mode signal 244 is not asserted, the Gray counter output signal 206 (corresponding to the count of the Gray counter 202) and the toggle flop output signal 216 are reset by the reset signal 240 to respective initial values that cause the comparison logic 226 to initially output a comparison logic output signal 228 with the nominal value.

If the reset signal 240 is not asserted while the test mode signal 244 is asserted, the Gray counter 202 will reset, but the toggle flop 214 will not reset. Accordingly, when the test mode signal 244 is asserted and the reset signal 240 is not asserted for two cycles of the clock signal 242, and the counter with diagnostic circuitry 238 otherwise operates without fault, the parity logic output signal 210 and the toggle flop output signal 216 can be forced to mismatch for one clock cycle of the clock signal 204. A one clock cycle mismatch of the parity logic output signal 210 and the toggle flop output signal 216 causes the comparator 228 to output the faulty operation value for one clock cycle of the clock signal 204, which causes the pulse detection logic 234 to output a fault indication signal 236 indicating a fault condition for one clock cycle of the clock signal 204. This can be used to test that the counter with diagnostic circuitry 238 is working properly.

Figure 3A:
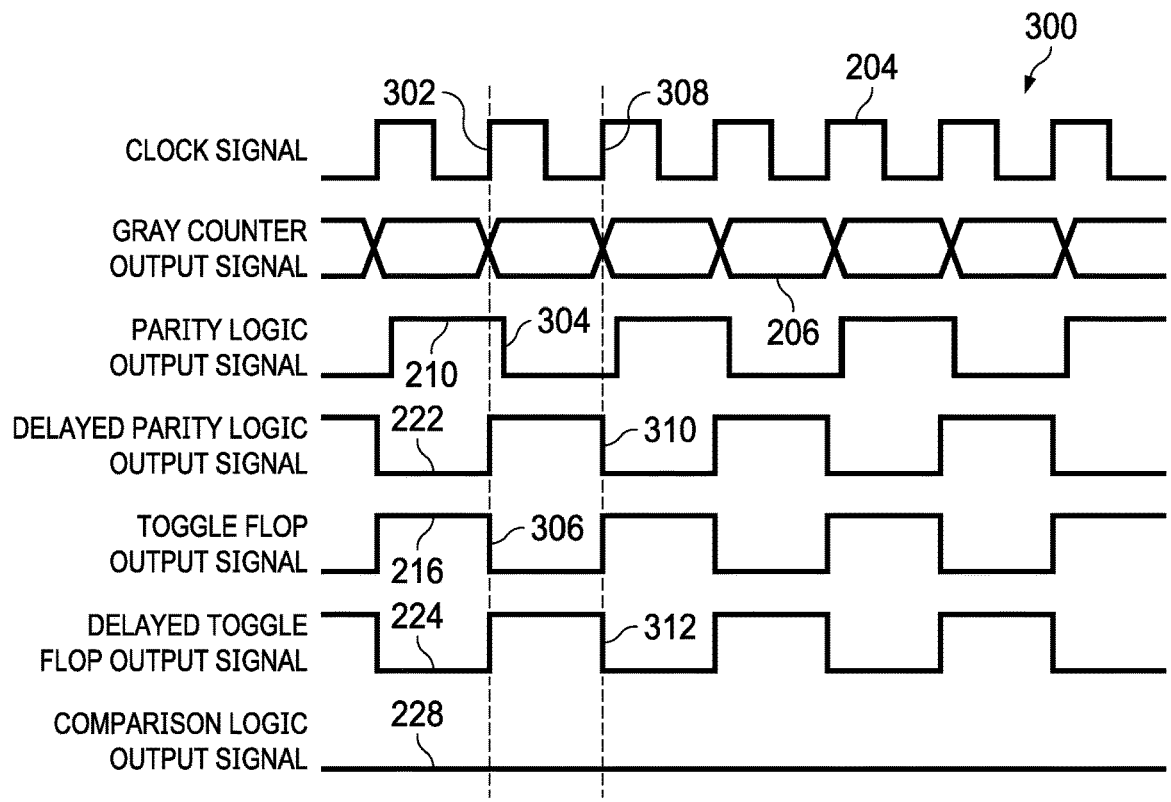
FIG. 3A shows an example waveform for nominal operation of a counter with diagnostic circuitry according to FIG. 2A.

FIG. 3A shows an example waveform for nominal operation 300 of a counter with diagnostic circuitry 200 according to FIG. 2A. A first rising edge 302 of the clock signal 204 causes the Gray counter 202 to iterate its count, causing a parity toggle event 304 in the parity logic output signal 210. The first rising edge 302 of the clock signal 204 also causes a toggle flop toggle event 306 in the toggle flop output signal 216. The parity logic output signal 304 waveform is drawn to show a delay between the first rising edge 302 and parity toggle event 304, but not between the first rising edge 302 and the toggle flop toggle event 306. The delay recognizes that a circuit path including the Gray counter 202 and the parity logic 208 may be longer than a circuit path including the toggle flop 214. (In some examples, the toggle flop toggle event 306 may be more delayed than the parity toggle event 304.) The first and second delay stages 212, 218 prevent this delay from causing glitches in the comparison logic output signal 228.

A second rising edge 308 of the clock signal 204 causes the first and second delay stages 212, 218 to synchronously toggle in response to the parity logic output signal 210 and the toggle flop output signal 216, respectively, producing a delayed parity toggle event 310 and a delayed toggle flop event 312, respectively. The waveform for nominal operation 300 shown in FIG. 3A results in the comparison logic 226 producing a comparison logic output signal 228 with the nominal value (as shown in FIG. 3A, a logical zero). Accordingly, the comparison logic output signal 228 does not toggle.

Figure 3B:
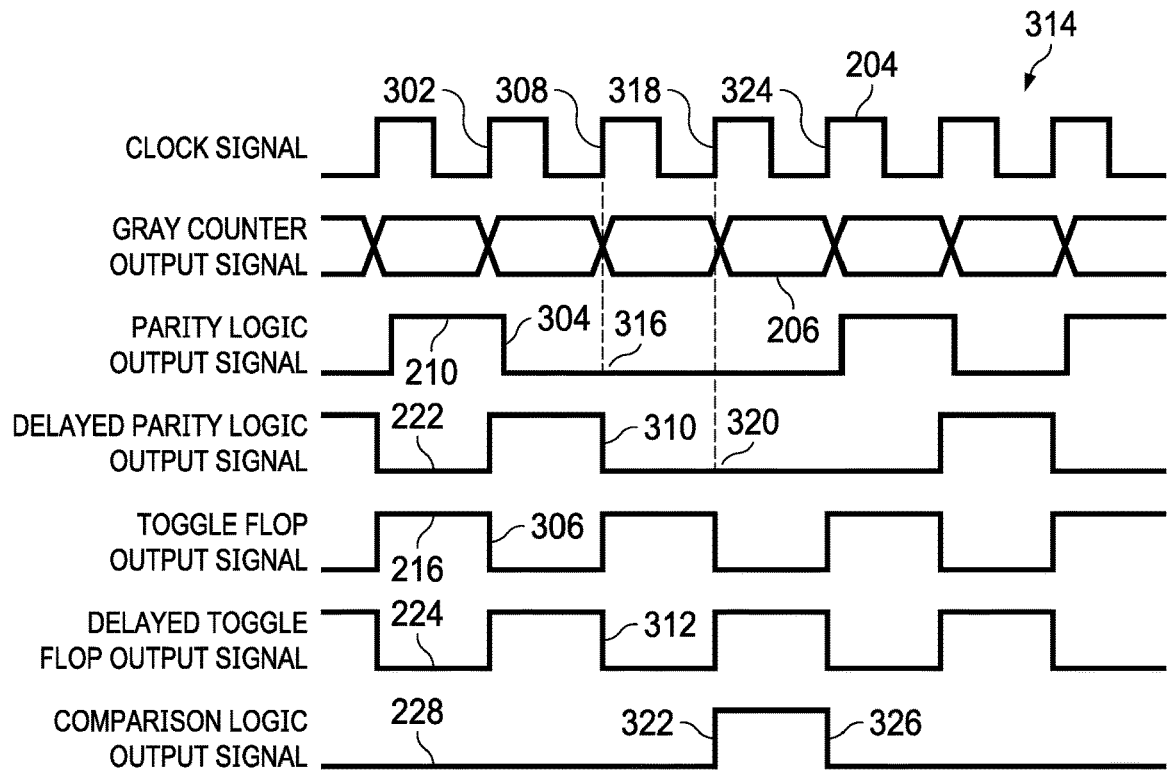
FIG. 3B shows an example waveform for faulty operation of a counter with diagnostic circuitry according to FIG. 2A.

FIG. 3B shows an example waveform for faulty operation 314 of a counter with diagnostic circuitry 200 according to FIG. 2A. At the second rising clock edge 308, the parity logic output signal 210 fails to toggle 316, corresponding to a fault condition in the Gray counter output signal 206. At a third rising clock edge 318 of the clock signal 204, the delayed parity logic output signal 222 fails to toggle 320, in response to the parity logic output signal 210 failing to toggle 316 in response to the second rising clock edge 308. Meanwhile, the toggle flop output signal 216 and delayed toggle flop output signal 224 toggle normally. Accordingly, the comparison logic output signal 228 toggles 322 to the faulty operation value. At a fourth rising clock edge 324 of the clock signal 204, the counter with diagnostic circuitry 200 returns to nominal operation, resulting in the comparison logic output signal 228 toggling 326 back to the nominal operation value. Accordingly, the comparison logic output signal 228 is set to the faulty operation value for a full clock cycle of the clock signal 204, causing the fault indication signal 236 to indicate a fault condition.

Figure 4:
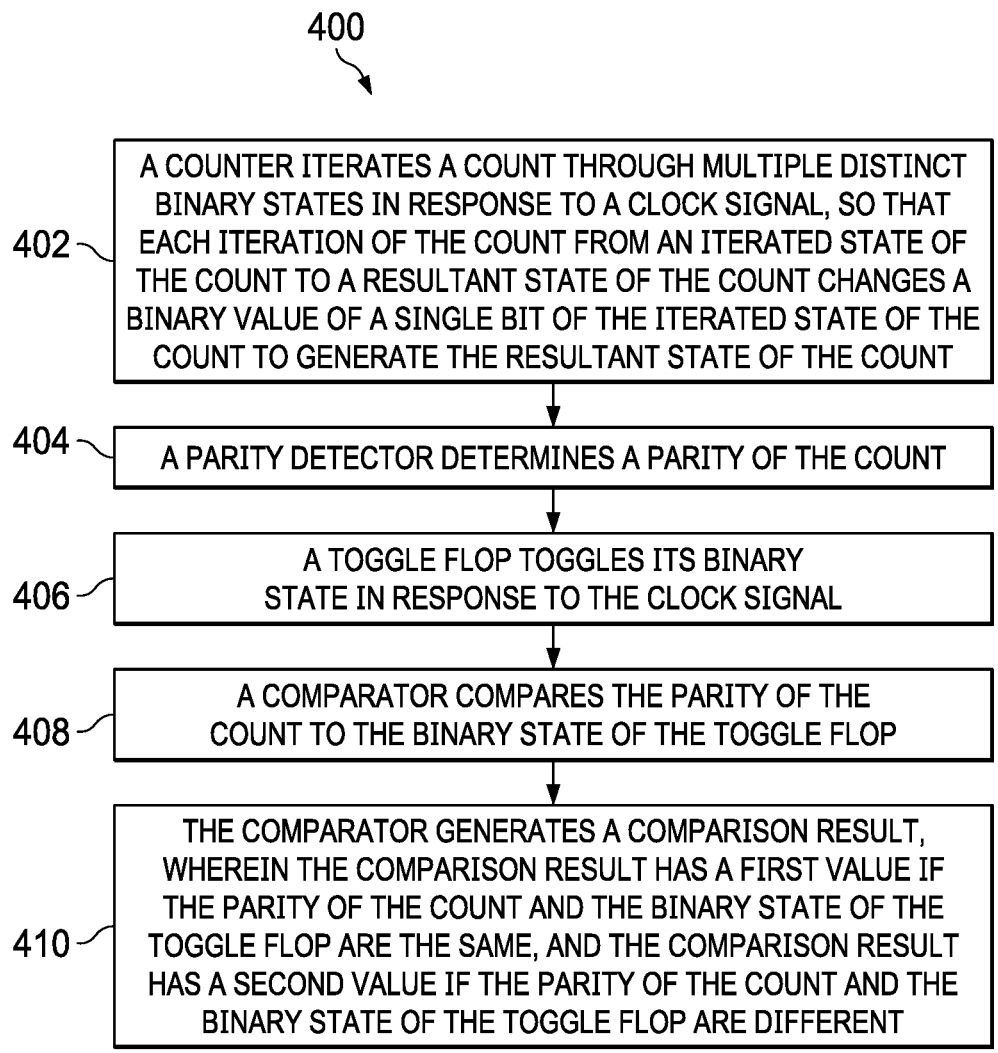
FIG. 4 shows an example of a process for operation of a counter with diagnostic circuitry.

FIG. 4 shows an example of a process 400 for operation of a counter with diagnostic circuitry 200. In step 402, a counter iterates a count through a set of binary states in response to a clock signal, so that each iteration of the count from an iterated state of the count to a resultant state of the count changes a binary value of a single bit of the iterated state of the count to generate the resultant state of the count. In step 404, a parity detector determines a parity of the count. In step 406, a toggle flop toggles its binary state in response to the clock signal. In step 408, a comparator compares the parity of the count to the binary state of the toggle flop. In step 410, the comparator generates a comparison result, wherein the comparison result has a first value if the parity of the count and the binary state of the toggle flop are the same, and the comparison result has a second value if the parity of the count and the binary state of the toggle flop are different.

Modifications are possible in the described embodiments, and other embodiments are possible, within the scope of the claims.

In some embodiments, a numerical binary counter is used (for example, 00 01 10 11), and the resulting count is converted to a Gray count to emulate the Gray counter described herein. In some embodiments, any soft or stuck-at fault of the Gray counter or the parity logic breaks the once-per-cycle parity toggle of the parity logic output signal, resulting in an error signal from the pulse detection logic that is at least one clock period long.

In some embodiments, the pulse detection logic detects a signal with the faulty operation value that lasts for a duration other than a clock period, such as a half period (from one clock signal edge to a next clock signal edge) or two periods.

In some embodiments, the delay blocks delay respective delay block input signals for a duration other than a clock period, such as a half period (from one clock signal edge to a next clock signal edge) or two periods. In some embodiments, a counter with diagnostic circuitry can be used without delay blocks.

In some embodiments, the nominal value corresponds to the parity of the Gray count being the same as the output of the toggle flop. In some embodiments, the nominal value corresponds to the parity of the Gray count being different from the output of the toggle flop.

In some examples, a numerical counter, such as a base-2 numerical counter, is used, with logic that checks whether a difference between values of two consecutive counts is one. In some examples, a numerical counter, such as a base-2 numerical counter, is used, with logic that converts the base-2 numerical count value to a Gray counter value.

What is claimed is:

1. A counter system, comprising:
    a counter including a counter input and a counter output, the counter input adapted to receive a clock signal, wherein the counter is configured to iterate a count through a set of binary states in response to the clock signal, wherein the counter output is configured to output the count;
    a parity detector including a parity detector input and a parity detector output, the parity detector input coupled to the counter output, the parity detector configured to output a parity in response to the parity detector input;
    a toggle flop including a first toggle flop input, a second toggle flop input, and a toggle flop output, the first toggle flop input coupled to the toggle flop output and the second toggle flop input adapted to receive the clock signal, wherein the toggle flop is configured to output a binary flop value and to toggle the binary flop value between zero and one in response to the first toggle flop input and the clock signal; and
    a comparator including a first comparator input, a second comparator input, and a comparator output, the first comparator input coupled to the parity detector output and the second comparator input coupled to the toggle flop output, wherein the comparator is configured to output a first comparator value if the first comparator input and the second comparator input are the same, and to output a second comparator value if the first comparator input and the second comparator input are different.

2. The counter system of claim 1, wherein each iteration of the count from an iterated state of the count to a resultant state of the count changes a binary value of a single bit of the iterated state of the count to generate the resultant state of the count.

3. The counter system of claim 1, further comprising a pulse detection logic including a first pulse detection input, a second pulse detection input, and a pulse detection output, the first pulse detection input coupled to the comparator output and the second pulse detection input adapted to receive the clock signal, wherein the pulse detection logic is configured to output a fault detected signal in response to the clock signal and the comparator output.

4. The counter system of claim 3, wherein the pulse detection logic is configured to condition outputting the fault detected signal on the comparator output that is not a nominal value having a duration of at least a period of the clock signal.

5. The counter system of claim 3, further comprising a switch including a first switch input, a second switch input, and a switch output, the first switch input coupled to the comparator output, the second switch input adapted to receive a test qualifier signal, and the switch output coupled to the first pulse detection input, wherein the switch is configured to output the first switch input in response to the second switch input.

6. The counter system of claim 1, further comprising:
    a first delay block including a first input, a second input, and a first output, the first input coupled to the parity detector output, the second input adapted to receive the clock signal, and the first output coupled to the first comparator input; and
    a second delay block including a third input, a fourth input, and a second output, the third input coupled to the toggle flop output, the fourth input adapted to receive the clock signal, and the second output coupled to the second comparator input.

7. The counter system of claim 1, wherein the counter is a Gray counter.

8. The counter system of claim 1, further comprising a logical inverter having an inverter input and an inverter output;
    wherein the inverter input is coupled to the toggle flop output and the inverter output is coupled to the first toggle flop input.

9. The counter system of claim 1, wherein the comparator is configured to perform a Boolean XOR operation or a Boolean XNOR operation.

10. The counter system of claim 1, wherein the counter is configured to iterate the count so that the count is cyclical.

11. The counter system of claim 1,
    wherein the counter input is a first counter input and the counter includes a second counter input, the second counter input adapted to receive a reset signal;
    wherein the toggle flop includes a third toggle flop input, the third toggle flop input adapted to receive the reset signal;
    wherein the counter is configured to reset to a counter reset value in response to receiving the reset signal;
    wherein the toggle flop is configured to reset to a toggle flop reset value in response to receiving the reset signal; and
    wherein either the first comparator value or the second comparator value is a nominal value, and the counter reset value and the toggle flop reset value are selected to cause the comparator to output the nominal value.

12. A method for operating a counter, the method comprising:
    iterating a count, using a counter, through a set of binary states in response to a clock signal;
    determining a parity of the count using a parity detector;

toggling a binary state of a toggle flop in response to the clock signal;

comparing the parity of the count to the binary state of the toggle flop, using a comparator;

generating a comparison result using the comparator, wherein the comparison result has a first value if the parity of the count and the binary state of the toggle flop are the same, and the comparison result has a second value if the parity of the count and the binary state of the toggle flop are different; and generating a fault detected signal in response to the clock signal and to the comparison result.

13. The method of claim 12, wherein each iteration of the count from an iterated state of the count to a resultant state of the count changes a binary value of a single bit of the iterated state of the count to generate the resultant state of the count.

14. The method of claim 12, wherein the generating of the fault detected signal is conditioned on the comparison result having a value that is not a nominal value for a duration of at least a period of the clock signal.

15. The method of claim 12, further comprising preventing the generating of the fault detected signal if a test suppression signal is received.

16. The method of claim 12, further comprising:
delaying a signal corresponding to the parity of the count from reaching the comparator until a selected one of a rising clock edge or a falling clock edge has passed; and delaying a signal corresponding to the binary state of the toggle flop from reaching the comparator until the selected one of the rising clock edge or the falling clock edge has passed.

17. The method of claim 12, wherein the counter is a Gray counter.

18. The method of claim 12, wherein the comparing includes performing a Boolean XOR operation or a Boolean XNOR operation on the parity of the count and the binary state of the toggle flop.

19. The method of claim 12, wherein the iterating is performed so that the count is cyclical.

20. The method of claim 12, further comprising:
receiving a reset signal;
resetting the count to an initial count value in response to the reset signal; and
resetting the toggle flop to an initial toggle flop value in response to the reset signal;
wherein either the first value or the second value is a nominal value, and the initial count value and the initial toggle flop value are selected to cause the comparison result to be the nominal value.

21. A method for operating a counter, the method comprising:
iterating a count, using a counter, through a set of binary states in response to a clock signal;
determining a parity of the count using a parity detector;
toggling a binary state of a toggle flop in response to the clock signal;
comparing the parity of the count to the binary state of the toggle flop, using a comparator; and
generating a comparison result using the comparator, wherein the comparison result has a first value if the parity of the count and the binary state of the toggle flop are the same, and the comparison result has a second value if the parity of the count and the binary state of the toggle flop are different, wherein the toggling is performed by feeding back an output of the toggle flop to an input of the toggle flop through a logical inverter.

22. The method of claim 21, wherein the counter is a Gray counter.

* * * * *